(12) United States Patent
Lee et al.

(10) Patent No.: US 7,639,527 B2
(45) Date of Patent: Dec. 29, 2009

(54) PHASE CHANGE MEMORY DYNAMIC RESISTANCE TEST AND MANUFACTURING METHODS

(75) Inventors: Ming-Hsiu Lee, Hsinchu (TW); Bipin Rajendran, White Plains, NY (US); Chung Hon Lam, Peekskill, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 181 days.

(21) Appl. No.: 11/970,348

(22) Filed: Jan. 7, 2008

(65) Prior Publication Data

US 2009/0175071 A1    Jul. 9, 2009

(51) Int. Cl.
*G11C 11/00* (2006.01)

(52) U.S. Cl. .................................. 365/163; 365/201
(58) Field of Classification Search ................ 365/113
See application file for complete search history.

(56) References Cited

U.S. PATENT DOCUMENTS

| | | | |
|---|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |

(Continued)

FOREIGN PATENT DOCUMENTS

CN        1462478       12/2003

(Continued)

OTHER PUBLICATIONS

"Magnetic Bit Boost," www.sciencenews.org, Dec. 18 & 25, 2004, p. 389, vol. 166.

(Continued)

*Primary Examiner*—Tan T. Nguyen
(74) *Attorney, Agent, or Firm*—Haynes Baffel & Wolfeld LLP

(57) ABSTRACT

A method for testing an integrated circuit memory device includes applying a sequence of test pulses to a memory cell on the device, where the test pulses result in current through the memory cell having an amplitude dependent on the test pulse. Resistance in the memory cell is measured in response to the sequence of test pulses. A parameter set is extracted from the resistance measurements which includes at least one numerical coefficient that models dependency of the measured resistance on the amplitude of the current through the memory cell. The extracted numerical coefficient or coefficients are associated with the memory device, and used for controlling manufacturing operations.

21 Claims, 6 Drawing Sheets

U.S. PATENT DOCUMENTS

| | | |
|---|---|---|
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,066,870 A | 5/2000 | Siek |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,316,348 B1 | 11/2001 | Fu et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung et al. |
| 6,584,589 B1 * | 6/2003 | Perner et al. ............... 714/721 |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,620,715 B1 | 9/2003 | Blosse et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,744,088 B1 | 6/2004 | Dennison |
| 6,746,892 B2 | 6/2004 | Lee et al. |
| 6,750,079 B2 | 6/2004 | Lowrey et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,805,563 B2 | 10/2004 | Ohashi et al. |
| 6,808,991 B1 | 10/2004 | Tung et al. |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,888,750 B2 | 5/2005 | Walker et al. |
| 6,894,304 B2 | 5/2005 | Moore |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,864 B2 | 6/2006 | Nishida et al. |
| 7,067,865 B2 | 6/2006 | Lung et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,164,147 B2 | 1/2007 | Lee et al. |
| 7,166,533 B2 | 1/2007 | Happ |
| 7,214,958 B2 | 5/2007 | Happ |
| 7,220,983 B2 | 5/2007 | Lung |
| 7,277,317 B2 | 10/2007 | Le Phan et al. |
| 2001/0055838 A1 | 12/2001 | Walker et al. |
| 2002/0070457 A1 | 6/2002 | Sun et al. |
| 2002/0072223 A1 | 6/2002 | Gilbert et al. |
| 2002/0081833 A1 | 6/2002 | Li et al. |
| 2002/0113273 A1 | 8/2002 | Hwang et al. |
| 2002/0182835 A1 | 12/2002 | Quinn |
| 2003/0095426 A1 | 5/2003 | Hush et al. |
| 2004/0026686 A1 | 2/2004 | Lung |
| 2004/0051094 A1 | 3/2004 | Ooishi |
| 2004/0051161 A1 | 3/2004 | Tanaka et al. |
| 2004/0113232 A1 | 6/2004 | Johnson et al. |
| 2004/0165422 A1 | 8/2004 | Hideki et al. |
| 2004/0178172 A1 | 9/2004 | Huang et al. |
| 2004/0208038 A1 | 10/2004 | Idehara |
| 2005/0018526 A1 | 1/2005 | Lee |
| 2005/0019975 A1 | 1/2005 | Lee et al. |
| 2005/0029502 A1 | 2/2005 | Hudgens |
| 2005/0062087 A1 | 3/2005 | Chen et al. |
| 2005/0093022 A1 | 5/2005 | Lung |
| 2005/0106919 A1 | 5/2005 | Layadi et al. |

| | | |
|---|---|---|
| 2005/0130414 A1 | 6/2005 | Choi et al. |
| 2005/0167656 A1 | 8/2005 | Sun et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0215009 A1 | 9/2005 | Cho |
| 2005/0285096 A1 | 12/2005 | Kozicki |
| 2006/0038221 A1 | 2/2006 | Lee et al. |
| 2006/0043617 A1 | 3/2006 | Abbott |
| 2006/0073642 A1 | 4/2006 | Yeh et al. |
| 2006/0091476 A1 | 5/2006 | Pinnow et al. |
| 2006/0108667 A1 | 5/2006 | Lung |
| 2006/0110878 A1 | 5/2006 | Lung et al. |
| 2006/0110888 A1 | 5/2006 | Cho et al. |
| 2006/0118913 A1 | 6/2006 | Yi et al. |
| 2006/0154185 A1 | 7/2006 | Ho et al. |
| 2006/0175599 A1 | 8/2006 | Happ |
| 2006/0226409 A1 | 10/2006 | Burr et al. |
| 2006/0234138 A1 | 10/2006 | Fehlhaber et al. |
| 2006/0281216 A1 | 12/2006 | Chang et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0010054 A1 | 1/2007 | Fan et al. |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0224726 A1 | 9/2007 | Chen et al. |
| 2007/0235811 A1 | 10/2007 | Furukawa et al. |
| 2007/0246699 A1 | 10/2007 | Lung |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0014676 A1 | 1/2008 | Lung et al. |
| 2008/0198674 A1* | 8/2008 | Keller ......................... 365/201 |

FOREIGN PATENT DOCUMENTS

| | | |
|---|---|---|
| WO | WO-0079539 | 12/2000 |
| WO | WO-0145108 | 6/2001 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, FL, 2 pp.

Adler, D. et al., "Threshold Switching in Chalcogenide-Glass Thin Films," J. Appl/ Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "Highly Reliable 5nm Contact Cell Technology for 256Mb PRAM," VLSI Technology, Digest of Technical Papers, Jun. 14-16, 2005, pp. 98-99.

Ahn, S.J. et al., "A Highly Manufacturable High Density Phase Change Memory of 64 Mb and Beyond," IEEE IEDM 2004, pp. 907-910.

Atwood, G, et al., "90nm Phase Change Technology with μ Trench and Lance Cell Elements," VLSI Technology, Systems and Applications, Apr. 23-25, 2007, pp. 1-2.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phrase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurments of Thin Films Silicon Dioxide", Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search=nonvolatile%20high%20density%20high%20performance%20phase%20change%20memory, 8 pages.

Wicker, Guy, "A Comprehensive Model of Submicron Chalcogenide Switching Devices," Doctoral Dissertation, Wayne State University, Detroit, MI, 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Lung, Hsiang-Lan et al., "Phase Change Memory Cell Array with Self-Converged Bottom Electrode and Method for Manufacturing," U.S. Appl. No. 11/855,983, filed on Sep. 14, 2007, 40 pages.

* cited by examiner

PHASE CHANGE MEMORY DYNAMIC RESISTANCE TEST AND MANUFACTURING METHODS

PARTIES TO A JOINT RESEARCH AGREEMENT

International Business Machines Corporation, a New York corporation; and Macronix International Corporation, Ltd., a Taiwan R.O.C. corporation, are parties to a Joint Research Agreement.

BACKGROUND OF THE INVENTION

1. Field of the Invention

The present invention relates to high density memory devices based on phase change materials like chalcogenides and others, and to methods for manufacturing such devices.

2. Description of Related Art

Phase change based memory materials, like chalcogenide based materials and similar materials, can be caused to change phase between an amorphous solid phase and a crystalline solid phase by application of electrical current at levels suitable for implementation in integrated circuits. The generally amorphous state is characterized by higher resistivity than the generally crystalline state, which can be readily sensed to indicate data. Thus, phase change materials can be characterized as a type of programmable resistive memory material. These properties have generated interest in using phase change material and other programmable resistive memory material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change structure to stabilize in the amorphous state. It is desirable to minimize the magnitude of the reset current used to cause the transition of the phase change material from a crystalline state to an amorphous state. The memory cells using phase change material include an "active region" in the bulk of the phase change material of the cell in which the actual phase transitions are located. Techniques are applied to make the active region small, so that the amount of current needed to induce the phase change is reduced. Also, techniques are used to thermally isolate the active region in the phase change cell so that the resistive heating needed to induce the phase change is confined to the active region.

The magnitude of the reset current needed for reset can also be reduced by reducing the size of the phase change material element in the cell and/or the contact area between electrodes and the phase change material, such that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalcogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Another technology developed by the assignee of the present application is referred to as a phase change bridge cell, in which a very small patch of memory material is formed as a bridge across a thin film insulating member located between electrodes. The phase change bridge is easily integrated with logic and other types of circuitry on integrated circuits. See, U.S. application Ser. No. 11/155,067, filed 17 Jun. 2005, entitled "Thin Film Fuse Phase Change RAM and Manufacturing Method," by Lung et al., incorporated by reference as if fully set forth herein, which application was owned at the time of invention and is currently owned by the same assignee.

Yet another approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same."

In co-pending U.S. Patent Application entitled PHASE CHANGE MEMORY CELL ARRAY WITH SELF-CONVERGED BOTTOM ELECTRODE AND METHOD FOR MANUFACTURING; application Ser. No. 11/855,983; filed 14 Sep. 2007; which is incorporated by reference as if fully set forth herein, a representative mushroom memory cell and manufacturing process are described in detail.

Manufacturability of integrated circuit memory devices, such as phase change memory devices, requires that efficient testing methodologies be provided for use during manufacturing. For example, it is desirable to detect faulty devices during manufacturing, such as before packaging of the individual die, in order to avoid packaging defective devices and wasting the expense of such packaging. Also, it is desirable to detect faulty devices during manufacturing, so that the manufacturing process can be tuned to improve yield.

Testing methodologies can require significant processing overhead for large scale integrated circuit devices, and can slow down the manufacturing process. Thus it is desirable to provide methodologies that provide good information with low processing overhead.

SUMMARY OF THE INVENTION

The present invention provides a testing and manufacturing technology for integrated circuit phase change memory devices based on the discovery that material properties of memory cells, such as the integrity of interfaces between contact and phase change material, voids in the phase change material and the like, and critical dimensions of memory cells, such as the area of contact between phase change material an electrode, can be detected by determining coefficients of a simple equation, such as the slope and intercept coefficients for a linear equation, fitted to the measurement of the dynamic resistance of the memory cell.

A method is described for testing an integrated circuit memory device. The method includes applying of test pulses to a memory cell on the device, where the test pulses result in current through the memory cell having an amplitude dependent on the test pulse. Resistance in the memory cell is measured in response to the sequence of test pulses. A parameter set is extracted from the measurements which includes at least one numerical coefficient that models dependency of the measured resistance on the amplitude of the current through the memory cell. The extracted numerical coefficient or coefficients are associated with the memory device, such as by storing the parameter set including the extracted numerical coefficient or coefficients in a computer readable medium on the integrated circuit or in a testing workstation to which the circuit is coupled.

In embodiments having an access device like a transistor, a gate to source voltage is applied to the transistor access device to bias it in a linear region of operation, during the step of applying the sequence of test pulses.

In an embodiment in which the memory can be characterized by having a bottom electrode contacting a phase change memory element in a contact area, the test pulses cause formation of a molten region within the phase change memory element near the bottom electrode having a volume dependent on the contact area and on the energy applied during the test. For each pulse in the sequence of pulses used in the test, a different volume of molten material results. The resistance measurements therefore change dynamically with the test pulses. For memory cells having the mushroom configuration and similar configurations, the extracted coefficients include a slope A and an intercept B for a function of the form R=A/I+B, where R is the measured resistance and I is the current in the device during a test pulse in the sequence. The slope A is a coefficient that depends primarily on the material properties of the memory cell. Therefore, when the slope A falls outside an expected range, the information can be used in deducing that the memory cell has a material fault, such as a void in a critical region of the phase change memory element, or a poor interface between one of the top and bottom electrodes. The intercept B is a coefficient that depends not only on material properties, but also on critical dimensions of the memory cell. Therefore, if the intercept B falls outside an expected range, or changes after stress is applied to the cell, the information can be used in deducing that a critical dimensions of the memory cell fall outside specified manufacturing tolerances, or other faults in interface structures are occurring.

The sequence of test pulses used for the purposes of measuring the dynamic resistance comprises varying voltage pulses having magnitude sufficient to melt a portion of the phase change element in the memory cell, and durations sufficient for thermal transients to settle before measuring the resistance. For example, in a representative embodiment the sequence of test pulses comprise more than 10, for example 40, varying voltage pulses having equal durations between about 20 and 100 ns, preferably about 40 ns, and increasing magnitude stepping in steps of about 0.1 to 0.01 V from about 0.6 V to about 1.5 V.

Based on analysis of the parameter set, an integrated circuit device can be discarded if the extracted numerical coefficient or coefficients indicate that the device is not reliable. Alternatively, the information in the parameter set can be used to stop a manufacturing process for additional devices if the extracted coefficients fall outside an acceptable range, and thereby indicate a fault has occurred in the manufacturing process.

In other embodiments, after performing a first dynamic resistance measurement as described above, the memory cell is subjected to a stress, such as a long voltage pulse or a number of set/reset cycles, and then a second dynamic resistance measurement is executed to develop a second parameter set. The first and second parameter sets can then be analyzed to determine characteristics of the memory cell.

A method of manufacturing an integrated circuit memory device is also described, including first performing manufacturing steps to produce a testable memory cell, then performing a dynamic resistance measurement as described above. Based on results of the dynamic resistance measurement, manufacturing method includes either performing further manufacturing steps on the integrated circuit device if the extracted parameter set meets specified guidelines, else discarding the integrated circuit device. Alternatively, the manufacturing method may include suspending the manufacturing line for analysis if the extracted parameter set falls outside specified guidelines, or else allowing the manufacturing line to continue manufacturing.

These and other embodiments, features, aspects, and advantages of the invention will become better understood with reference to the following description, appended claims and accompanying drawings.

DETAILED DESCRIPTION

Figure 1:
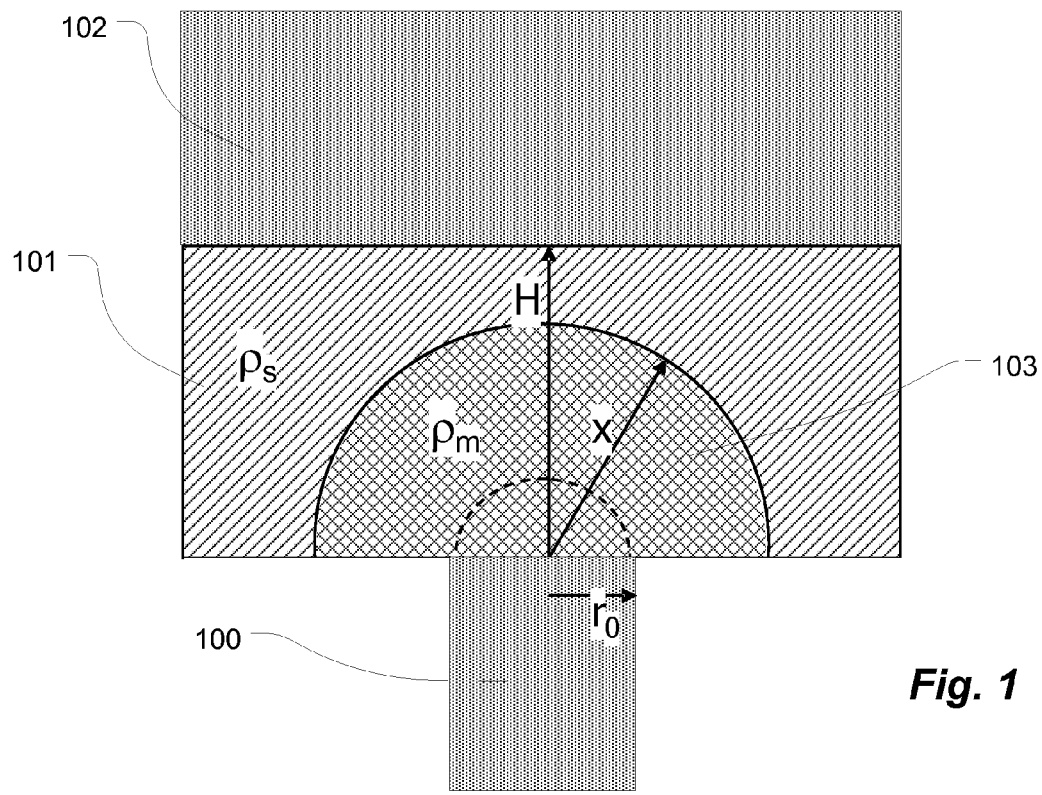
FIG. 1 is a simplified diagram of a mushroom style phase change memory cell including a molten region and a solid region as induced during dynamic resistance measurements described herein.

A detailed description is provided with reference to FIGS. 1-8. FIG. 1 is a simplified diagram of a mushroom style phase change memory cell including a bottom electrode 100, an element 101 comprising a phase change material, and a top electrode 102. The bottom electrode 100 in the illustrated embodiment is a pillar having a radius $r_0$ at the interface having a contact area, roughly $\pi r_0^2$, between element 101 and the bottom electrode 100. The top electrode 102 contacts the element 101 over substantially greater area than the contact area at the interface between the bottom electrode 100 and element 101.

Figure 5:
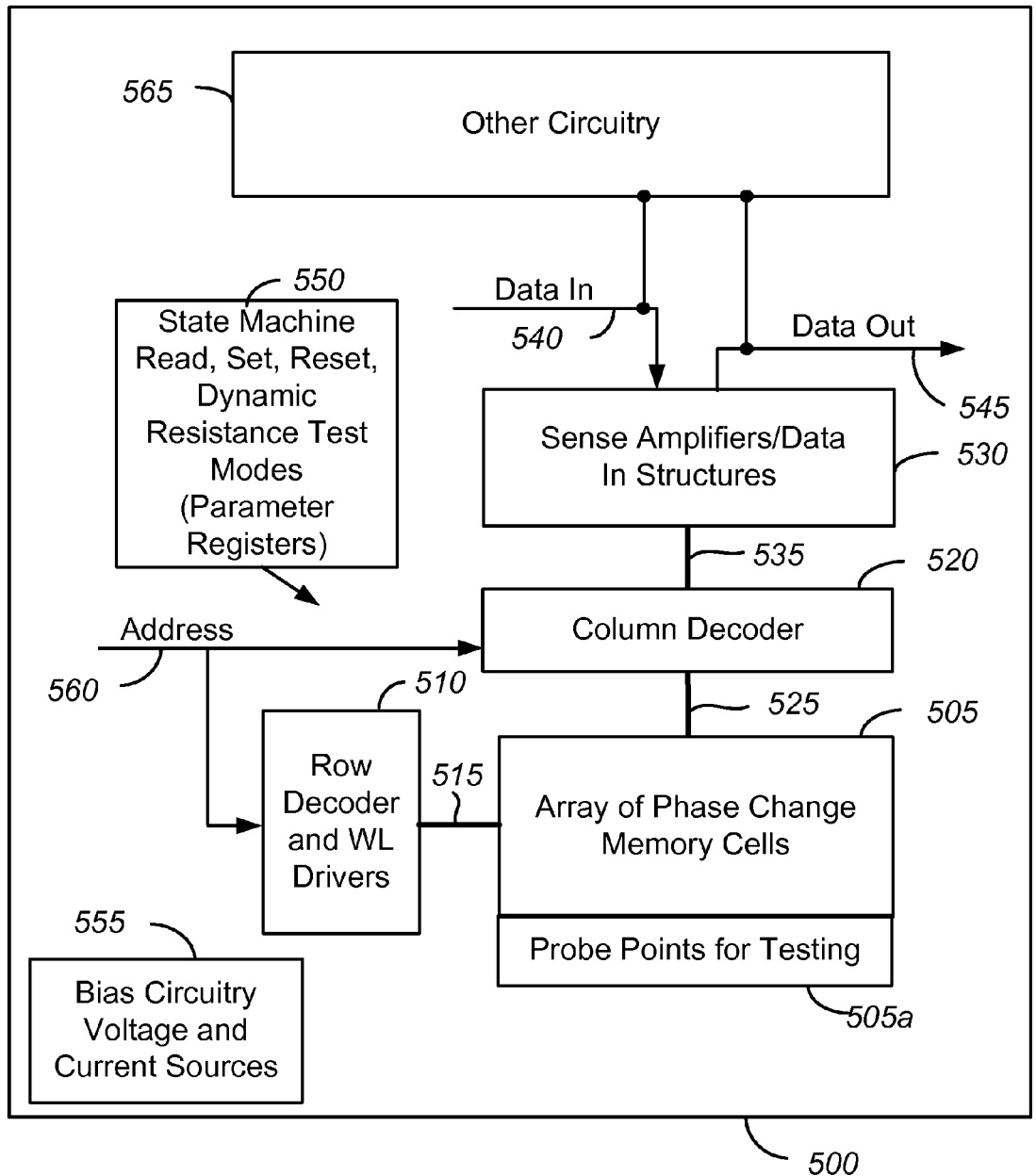
FIG. 5 is a simplified block diagram of an integrated circuit memory device as described herein including a dynamic resistance test mode.

In operation, bias circuitry (See, for example, bias circuitry voltage and current sources 555 of FIG. 5) applying voltages to an access device coupled to the bottom electrode and a bit line coupled to the top electrode can induce current to flow the memory element 101. During a read operation, and magnitude of current flow is small and insufficient to cause a phase change in the active region of the memory element 101. During a set operation, the current flow is adapted to cause a portion of memory element 101 to increase in temperature above a transition temperature sufficient to induce a phase transition between an amorphous state in active region and a crystalline state in the active region. During a reset operation, the current flow is adapted to cause a portion of the memory element 101 to melt and then cool off quickly enough that the active region remains in, or transitions to, an amorphous solid state.

In FIG. 1, an active region of the memory element 101 occurs adjacent to the interface between the bottom electrode 100 and a memory element 101. As described above, in order to measure dynamic resistance of the memory element for the purposes of testing and manufacturing as described herein, a sequence of test pulses is applied to the memory cell. The test pulses have magnitudes and durations sufficient to cause formation of a molten region 103 within the element 101, while the remainder of the memory only 101 remains in a solid phase. Also, the test pulses have durations sufficient for thermal transients to dissipate in the element 101, so that a dynamic resistance measurement can be taken on a relatively stable structure. Thus, dynamic resistance is defined as the resistance of the phase change cell when a constant current flows through the cell. This is a steady state measurement. Dynamic resistance can be measured using a simple scheme similar to that used to determine the R-I curve, while ensuring that the access transistor, or other access device, is biased in its linear region. This operation in the linear region enables us to subtract the transistor resistance and obtain the resistance of the phase change element 101 during programming. Although, dynamic resistance is a steady state measurement, the programming pulse can be relatively short, such as about 40 ns. All the thermal transients typically settle in less than 5 ns, so the measured resistance is the resistance of the cell when a constant current is flowing through the cell.

The size of the molten region depends on a critical dimension $r_0$, and the amount of power (VI) delivered by the test pulse. Thus, in order to measure the dynamic resistance a sequence of test pulses having varying powers, such as by having varying magnitudes and constant pulse widths, is applied to a memory cell. Each test pulse will induce a roughly hemispherical molten region 103 having a radius x. The sequence of test pulses includes a subset of test pulses which induce molten regions having a radius between about $r_0$, and the thickness H of the element 101. Because the resistivity $\rho_M$ of the molten phase change material is significantly different than the resistivity $\rho_S$ of the solid phase change material, a resistance measurement across the memory element will vary with the radius x.

Figure 2:
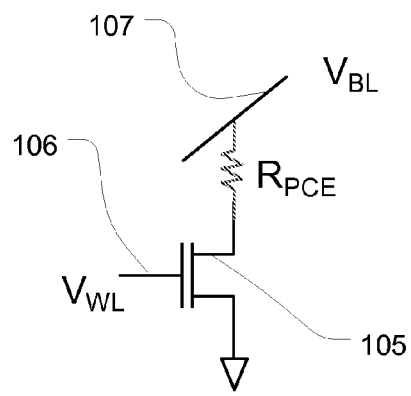
FIG. 2 is a schematic diagram of a single memory device and access device at a cross point of a bit line and a word line in an array of such devices subjected to testing as described herein

FIG. 2 illustrates the basic memory cell and access structure implemented within an array, including access transistor 105 having a gate coupled to a word line 106, a source coupled to ground, and a drain coupled to the memory cell bottom electrode. The memory cell top electrode is coupled to the bit line 107. The resistance $R_{PCE}$ of the phase change element 101 in the memory cell is represented by the resistor symbol in FIG. 2. The sequence of test pulses is applied to the bit line 107 while the access transistor 105 is used to select a memory cell coupled to the bit line 107. Current through the memory cell depends on the resistance $R_{PCE}$ of the memory element 101, as well as the transistor 105. During the process of applying a sequence of test pulses, where the access device is a transistor 105 as illustrated in FIG. 2, a voltage $V_{WL}$ on the word line is set to bias the transistor in its linear region after the seen in FIG. 3.

Figure 3:
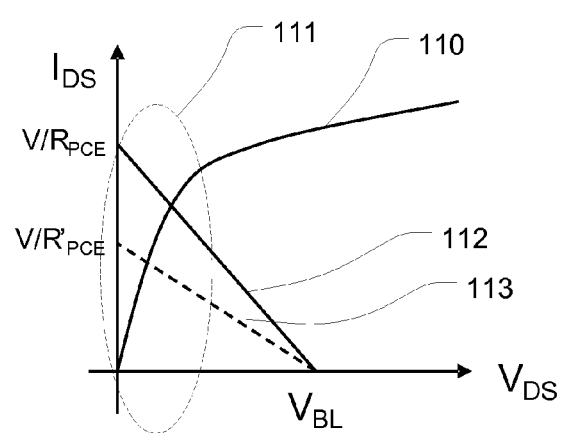
FIG. 3 is a graph of drain to source current versus drain to source voltage for an access device showing dynamic resistance measurements.
Figures 4A, 4B, 4C, 4D, 4E, 4F:
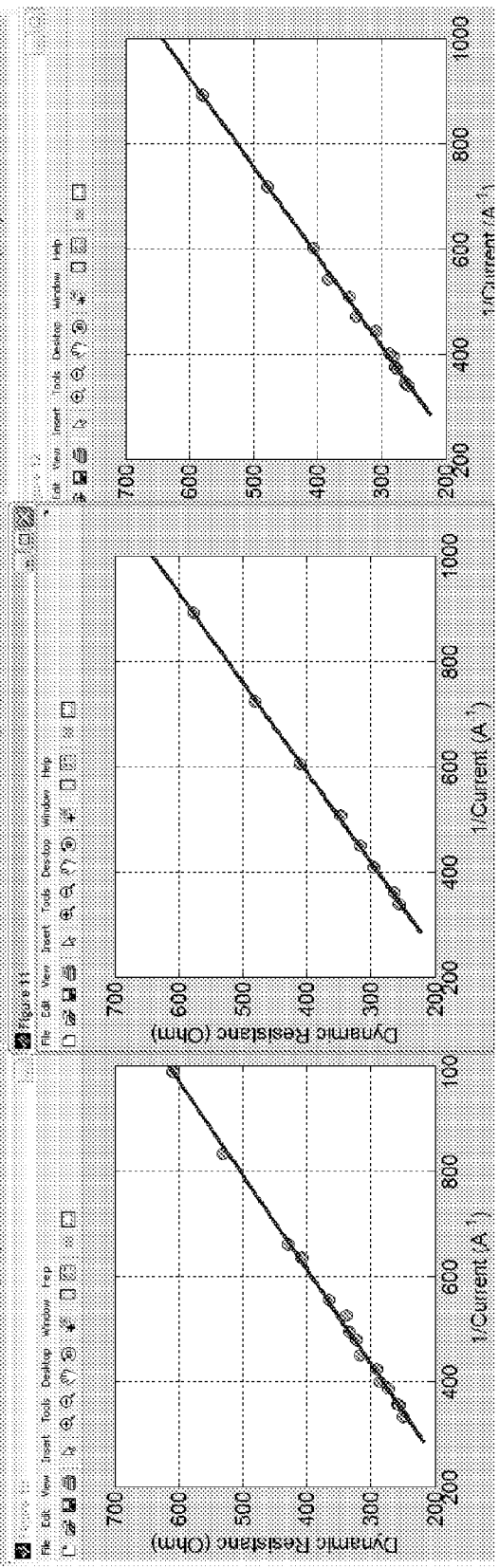
FIGS. 4a through 4f show the results of measurements of dynamic resistance for six different memory cells fitted to a linear curve.

FIG. 3 is a graph of drain-to-source current $I_{DS}$ versus drain-to-source voltage $V_{DS}$, including trace 110 for a transistor having a linear region 111 and a saturated region for higher drain voltages. Lines 112 and 113 are load lines for dynamic resistance measurements where the memory element 101 has a first resistance $R_{PCE}$ and a second resistance $R'_{PCE}$, respectively. As can be seen, the current through the memory cell and access structure depends on the resistance of the memory element 101.

It will be understood that a wide variety of materials can be utilized in implementation of the bottom and top electrodes 100 and 102, including metals such as aluminum, titanium nitride, and tungsten based materials as well as non-metal conductive material such as doped polysilicon. Alternatively, the bottom and top electrodes 100 and 102 may comprise TiAlN or TaAlN, or comprise, for further examples, one or more elements selected from the group consisting of Ti, W, Mo, Al, Ta, Cu, Pt, Ir, La, Ni, N, O and Ru and combinations thereof. TiN may be preferred because it makes a good contact with GST (discussed below) as a memory material, it is a common material used in semiconductor manufacturing, and it provides a good diffusion barrier at the higher temperatures at which GST transitions, typically in the 600-700 degree Celsius range.

Embodiments of the memory element 101 include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVa of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, for example U.S. Pat. No. 6,800,504, and U.S. Patent Application Publication No. US 2005/0029502.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Appropriate profiles for test pulses used for measurements described herein can be determined empirically or by modeling, and specifically adapted to a particular phase change alloy and cell structure. A material useful for implementation of a PCRAM described herein is $Ge_2Sb_2Te_5$.

Representative chalcogenide material can be characterized as follows: $Ge_xSb_yTe_z$, where x:y:z=2:2:5. Other compositions can be used with x: 0~5; y: 0~5; z: 0~10. GeSbTe with doping, such as N—, Si—, Ti—, P—, As— or other element doping may also be used. These materials can be formed by PVD sputtering or magnetron-sputtering method with reactive gases of Ar, $N_2$, and/or He, etc and chalcogenide at the pressure of 1 mtorr~100 mtorr. The deposition is usually done at room temperature. A collimator with an aspect ratio of 1~5 can be used to improve the fill-in performance. To improve the fill-in performance, the DC bias of several tens to several hundreds of volts is also used. Also, the combination of DC bias and the collimator can be used simultaneously. The post deposition annealing treatment with vacuum or $N_2$ ambient is sometimes needed to improve the crystallize state of chalcogenide material. The annealing temperature typically ranges 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance the states.

The FIGS. 4a-4f are plots of measurements of dynamic resistance in six different memory cells, where the dots are measurements for individual test pulses in a sequence of 40 test pulses about 40 nsec long, which are stepped from 0.6 V to 1.5V in increments of 0.015 V. The plots show the linear region of the measurements, in which the radius of the molten region is believed to fall in the range between $r_0$ and H as explained above. The lines on the plots represent a linear curve fitted to the measurements, of the form R=A/I+B, where R is the measured resistance and I is the current in the device during a test pulse, and the coefficients including the slope A and the intercept B indicate material properties of the tested cells and critical dimensions of the selected cells.

Table 1 below shows the results of extraction of the coefficients A and B for 12 selected memory cells. The mean value of A is about 0.5623 and the percent variation of A is about 5%. The mean value of B is about 60.36 and the percent variation of B is about 35%.

TABLE 1

| A | B |
|---|---|
| 0.60287 | 26.049 |
| 0.54801 | 80.396 |
| 0.54859 | 59.396 |
| 0.50238 | 110.56 |
| 0.54205 | 55.382 |
| 0.53921 | 75.798 |
| 0.56577 | 48.71 |
| 0.58452 | 62.407 |
| 0.58018 | 40.884 |
| 0.55871 | 56.958 |
| 0.58769 | 53.065 |
| 0.5879 | 54.8 |

The parameter A depends only on material properties of the cell, and is independent of cell dimensions in the plotted linear region. Therefore, the percent variation is much smaller than the percent variation in B, which also depends on the dimensions of the cell including $r_0$.

One possible explanation for this observation can be derived as follows. The molten region 103 has an electrical resistivity $\rho_M$ much less than the electrical resistivity $\rho_S$ of the surrounding solid material in the memory element 101. The resistance of the cell can be derived from the following equation:

$$R = \frac{\rho_m}{4r_0} + \int_{r_0}^{x} \rho_m \frac{1}{2\pi y^2} dy + \int_{x}^{H} \rho_s \frac{1}{2\pi y^2} dy$$

The three components of this computation include first, the resistance of the molten hemispherical region having radius r0, second the resistance of the molten hemispherical region between radius $r_0$ and x, and the resistance of the solid material between x and H.

Performing the integration and expanding the equation results in the following:

$$R = \frac{1}{2\pi}\left[(1+\pi/2)\frac{\rho_m}{r_0} - \frac{\rho_s}{H}\right] + \frac{\rho_s - \rho_m}{2\pi}\left[\frac{1}{x}\right]$$

All of the values in this equation are constants, with the exception of x. It has been determined from simulations that the radius of the molten volume is linearly proportional to the current induced during the test pulse so that:

$$x = k_1 I$$

This phenomenon might be explained by the basic heat diffusion equation for the memory cell as follows:

$$\rho C_p \frac{\partial T(r,t)}{\partial t} = \frac{\partial}{\partial r}\left(k\frac{\partial T(r,t)}{\partial r}\right) + P(r,t)$$

At steady state, with a molten volume of radius x, we assume that the energy being supplied by the current is used to maintain this volume above the melting temperature. Thus, we obtain the following:

$$P(r,t) = -\frac{\partial}{\partial r}\left(k\frac{\partial T(r,t)}{\partial r}\right)$$

Since the input power density is equal to the amount of energy lost due to diffusion at steady state, we obtain equations for input power density as follows:

$$\frac{VI}{2\pi x^3/3}$$

We also obtained the equation for diffusion loss as follows:

$$k\left(\frac{\Delta T_m}{2\pi x^2}\right)$$

As result we can see that the radius x can be characterized as follows:

$$x \propto \left(\frac{V}{k\Delta T_m}\right)I$$

Thus, the radius x is proportional to the amount of energy applied during the test pulse.

Therefore, it can be seen that dynamic resistance of the memory cell can be represented by an equation of the form R=A/I+B, where $$A = \frac{1}{2\pi k_1}[\rho_s - \rho_m] \quad B = \frac{1}{2\pi}\left[(1+\pi/2)\frac{\rho_m}{r_0} - \frac{\rho_s}{H}\right]$$

Therefore, the slope A depends only on the material properties $k_1$, $\rho_S$ and $\rho_M$. The intercept B depends on material properties plus critical dimensions of the memory element $r_0$ and H.

In summary, the slope A is related to material properties of the memory cell being tested, and the intercept B is related to the material properties and to the physical structure of the cell. A healthy cell should have stable A and B values. A stable manufacturing line should have stable A and B values between the cells within the array, between die, between wafers and between lots. Thus by extracting the parameter set including the coefficients A and B, reliability of a memory cell can be predicted including the likelihood of degradation in switching ratio, the average lifetime before failure, required reset power drift with cycling, and so on. Also, the parameter set can be used to monitor process uniformity and the degree of variation between cells, between die, between wafers and so on.

FIG. 5 is a simplified block diagram of an integrated circuit in accordance with an embodiment. The integrated circuit 500 includes a memory array 505 implemented using phase change memory cells as described. A row decoder 510 having read, set and reset modes is coupled to a plurality of word lines 515 arranged along rows in the memory array 505. Block 505a represents probe points on the array suitable for coupling to a testing machine for the measurement of dynamic resistance. Alternatively, circuitry may be provided on chip to provide output indicating such measurements. A column decoder 520 is coupled to a plurality of bit lines 525 arranged along columns in the memory array 505 for reading, setting and resetting memory cells in the memory array 505. Addresses are supplied on bus 560 to column decoder 520 and row decoder 510. Sense amplifiers and data-in structures in block 530, including current sources for the read, set and reset modes, are coupled to the column decoder 520 via data bus 535. Data is supplied via the data-in line 540 from input/output ports on the integrated circuit 500 or from other data sources internal or external to the integrated circuit 500, to the data-in structures in block 530. In the illustrated embodiment, other circuitry 565 is included on the integrated circuit 500, such as a general purpose processor or special purpose application circuitry, or a combination of modules providing system-on-a-chip functionality supported by the phase change memory cell array. Data is supplied via the data-out line 545 from the sense amplifiers in block 530 to input/output ports on the integrated circuit 500, or to other data destinations internal or external to the integrated circuit 500.

A controller implemented in this example using bias arrangement state machine 550 controls the bias circuitry voltage and current sources 555 for the application of bias arrangements including read, set, reset and verify voltages and or currents for the word lines and bit lines, and controls the word line/source line operation using an access control process. Also, the state machine 550 may include out logic supporting a process for measuring dynamic resistance as described herein, including the generation of sequences of test pulses in coordination with the bias circuitry voltage and current sources 555, and other supporting logic functions, including parameter registers for storing the parameter sets in a machine-readable format extracted, as necessary. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Another embodiment consists of a similar integrated circuit as shown in FIG. 5 but without block 505a. The dynamic resistance measurements are performed by a special test mode through the integrated circuit.

In another embodiment, a separated test structure to the main memory array is provided for the dynamic resistance measurement. This test structure can have the similar cell design as the memory array 505 in the integrated circuit 500, or can have special design for testing purpose.

Figure 6:
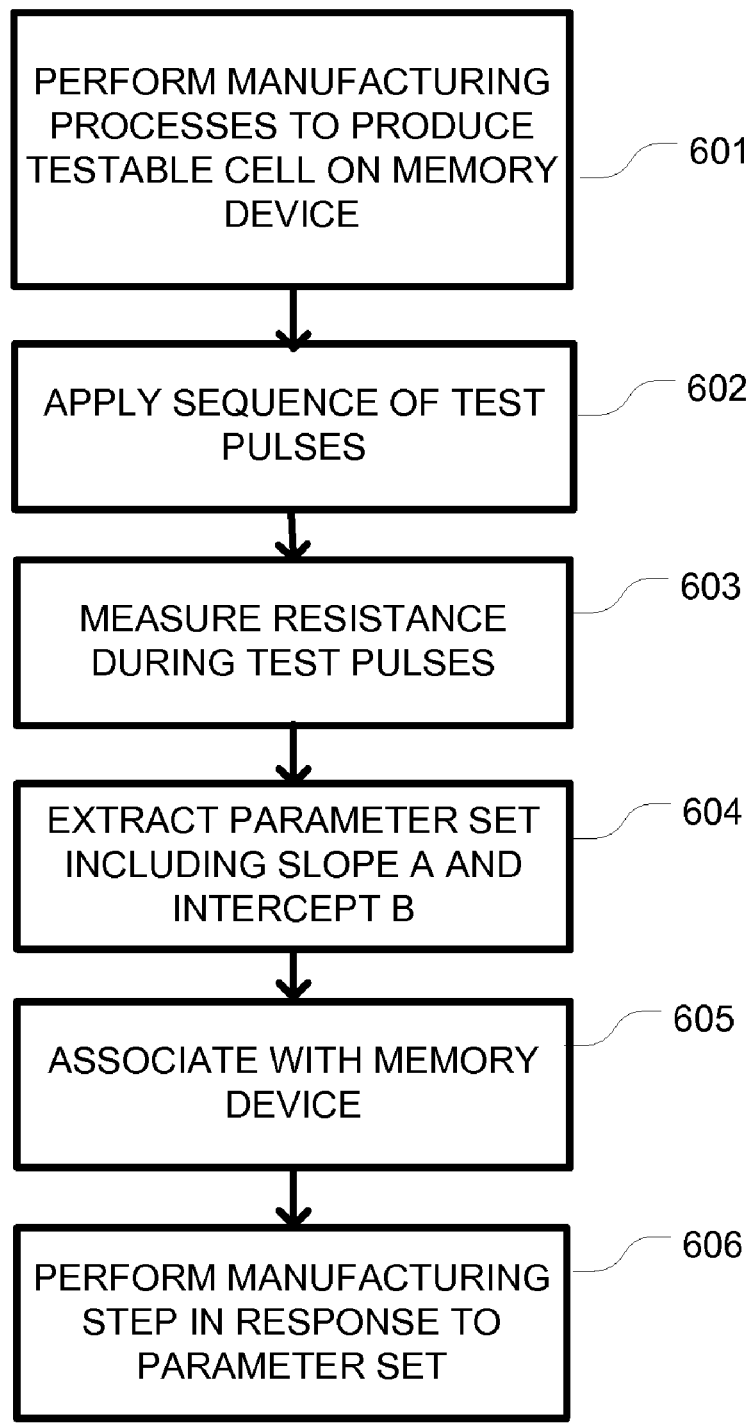
FIG. 6 is a flowchart of a testing and manufacturing method as described herein.

FIG. 6 is a flow chart for a manufacturing and testing process according to the present invention. As illustrated, the process begins with performing manufacturing processes sufficient to produce a testable cell on a memory device (block 601). The device is coupled to a testing machine, and probes are applied the probe points on the device to which a sequence of test pulses is applied (block 602). The dynamic resistance is measured during the test pulses (block 603). A parameter set is extracted including the slope A and intercept B as explained above for a linear fitting equation (block 604). The parameter set is then associated with the memory device, by storing it in a machine-readable format in a register file on the chip, or in memory on the test workstation associated with the tested chip (block 605). Finally, a manufacturing step is performed in response to the parameter set (block 606). Representative manufacturing steps include, if the parameter set falls outside the specified range, discarding the memory device, or stopping the manufacturing of further devices pending analysis of the manufacturing line and reasons for the detected anomalies, and so on.

Figure 7:
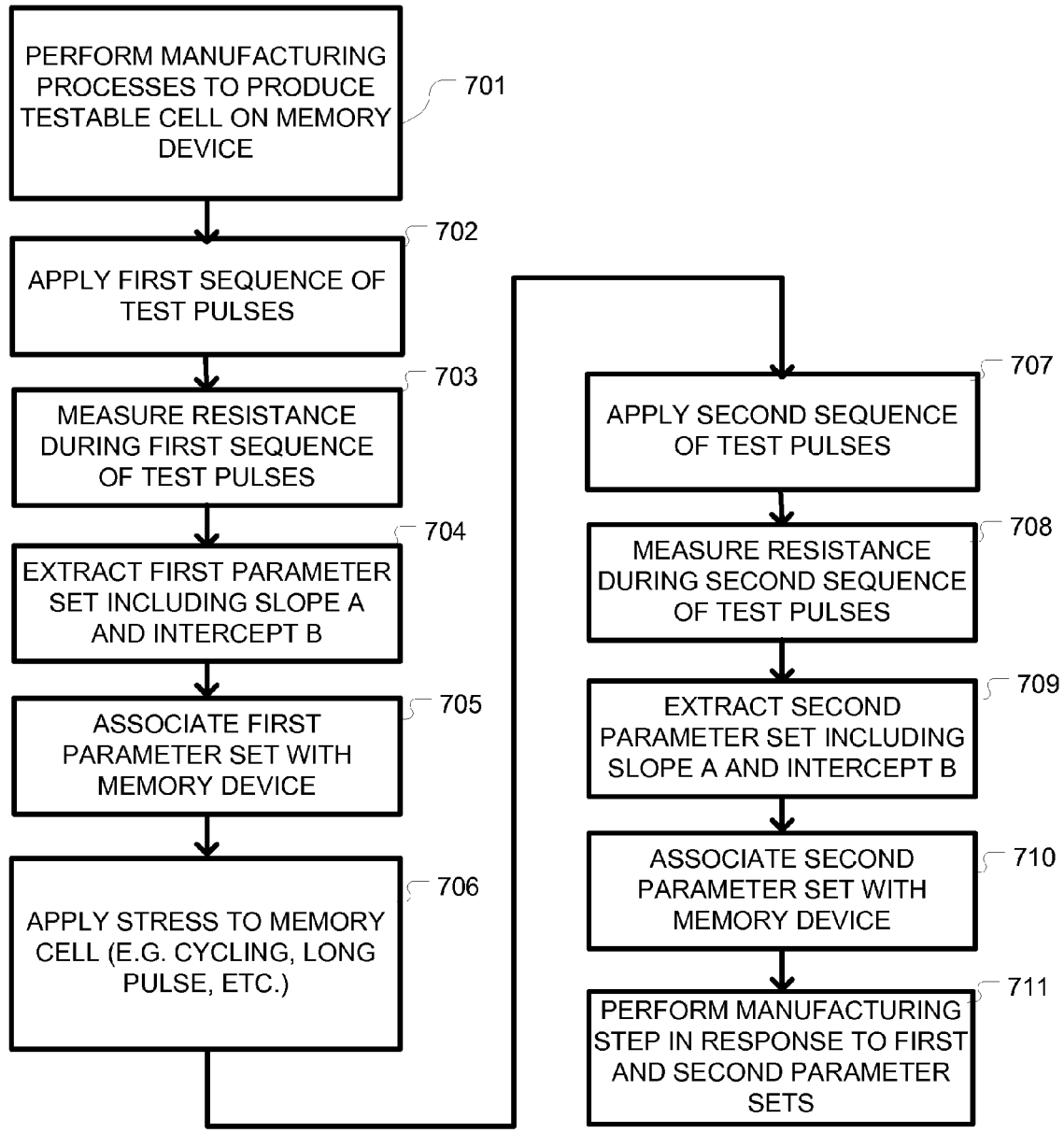
FIG. 7 has a flowchart of an alternative testing and manufacturing method as described herein.

FIG. 7 is a flow chart of an alternative manufacturing and testing process which measures changes in the parameter set after applying a stress to the memory device. Thus, the process begins with performing manufacturing processes sufficient to produce a testable cell on a memory device (block 701). The device is coupled to a testing machine, and probes are applied these probe points on the device to which a sequence of test pulses is applied (block 702). The dynamic resistance is measured during the test pulses (block 703). A first parameter set is extracted including the slope A and intercept B as explained above for a linear fitting equation (block 704). The first parameter set is then associated with the memory device, by storing in a machine-readable format and a register file on the chip, or in memory on the test workstation (block 705). Next, a stress is applied to the memory cell, such as reset/set cycling, a long pulse, or the like (block 706). Then, a second sequence of test pulses is applied to the memory cell (block 707). The dynamic resistance is measured during the second sequence of test pulses (block 708). A second parameter set is extracted including the slope A and intercept B as explained above for a linear fitting equation (block 709). The second parameter set is then associated with the memory device, by storing in a machine-readable format in a register file on the chip, or in memory on the test workstation (block 710). Finally, a manufacturing step is performed in response to the analysis of the first and second parameter sets (block 711). Representative manufacturing steps include, if the change in the parameter sets falls outside the specified range, discarding the memory device, or stopping the manufacturing of further devices pending analysis of the manufacturing line and reasons for the detected anomalies, and so on.

Figure 8:
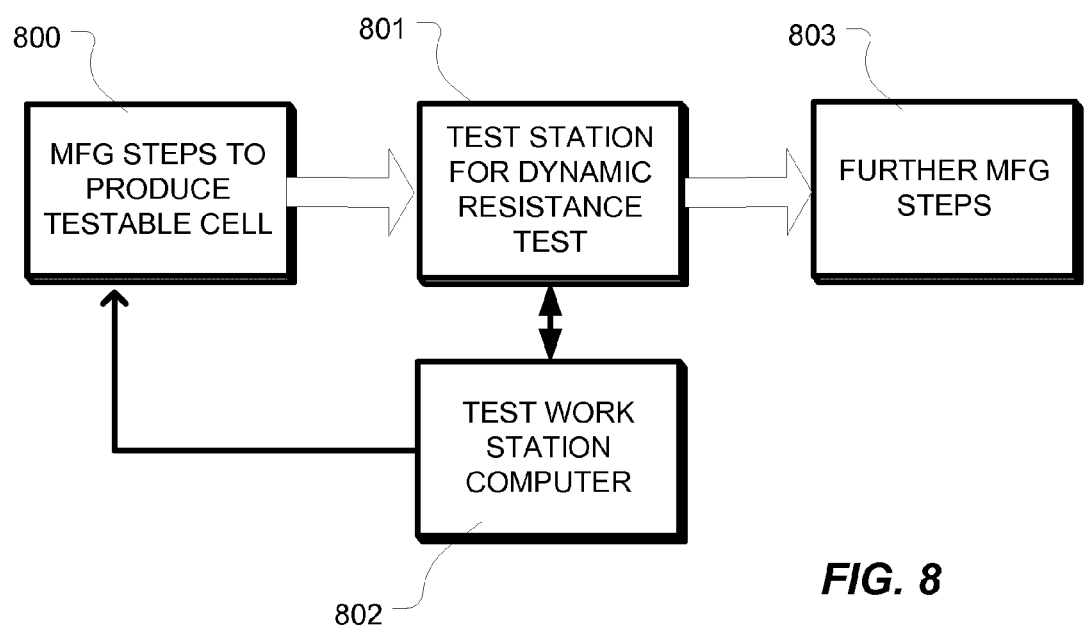
FIG. 8 is a simplified diagram of a manufacturing line including test station for dynamic resistance tests as described herein.

FIG. 8 is a simplified block diagram of the manufacturing line including equipment for performing the dynamic resistance test as described above. Such manufacturing line includes fabrication equipment 800 for performing manufacturing steps to produce a testable cell on a wafer. The wafer including the testable cell is moved to test station 801, in which the device is probed as explained above for measuring the dynamic resistance. The test station is coupled to a test workstation 802 which gathers the parameter sets as explained above, and performs such data processing has necessary to produce commands that affect a manufacturing operations. After testing, the memory device is passed to equipment 803 for further manufacturing steps, such as dicing the wafer containing the device, packaging the device and so on.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

What is claimed is:

1. A method for testing an integrated circuit memory device, the memory device including memory cells comprising phase change elements having a dynamic resistance, comprising:
    applying a sequence of test pulses to at least one memory cell on the device, which test pulses result in current through the memory cell having amplitude dependent on the test pulse;
    measuring resistance of the memory cell in response to the sequence of test pulses;
    extracting a parameter set including at least one numerical coefficient that models dependence of the measured resistance on the amplitude of the current through the memory cell; and
    associating the parameter set with the device.

2. The method of claim 1, including discarding the device if the at least one numerical coefficient indicates that the device is not reliable.

3. The method of claim 1, including stopping a manufacturing process for additional devices if the at least one numerical coefficient indicates that the device is faulty.

4. The method of claim 1, including storing a record on a machine readable medium for device including or pointing to the at least one numerical coefficient.

5. The method of claim 1, wherein the sequence of test pulses comprise varying voltage pulses having magnitudes sufficient to melt a portion of the memory cell, and durations for thermal transients to settle before said measuring resistance.

6. The method of claim 1, wherein the sequence of test pulses comprise more than 2 varying voltage pulses having equal durations between about 20 and 100 nsec.

7. The method of claim 1, wherein the at least one coefficient include a slope A and an intercept B for a function of the form $$R=A/I+B,$$

where R is the measured resistance and I is the current in the device during a test pulse in the sequence.

8. The method of claim 1, wherein the at least one coefficient include a first coefficient having a value that depends primarily on material properties of the memory cell.

9. The method of claim 1, wherein the at least one coefficient include a first coefficient having a value that depends primarily on material properties of the memory cell, and a second coefficient having a value that depends on material properties and critical dimensions of the memory cell.

10. The method of claim 1, wherein the memory cell is characterized by having a bottom electrode contacting a phase change memory element in a contact area, and by formation of a molten region during a test pulse near the bottom electrode having a volume dependent on the contact area and on current magnitude during the test.

11. The method of claim 1, including after said measuring resistance of the memory cell in response to the sequence of test pulses, subjecting the memory cell to a stress, and then
    applying a second sequence of test pulses to the memory cell on the device, which test pulses result in current through the memory cell having amplitude dependent on the test pulse;
    measuring resistance of the memory cell in response to the second sequence of test pulses;
    extracting a second parameter set including at least one numerical coefficient that models dependence of the measured resistance on the amplitude of the current through the memory cell during the second sequence of test pulses; and associating the second parameter set with the device.

12. The method of claim 1, wherein the memory cell is coupled to one of a bit line and a word line via an access transistor, and including biasing the access transistor in a linear region during said applying a sequence of test pulses.

13. A method for manufacturing an integrated circuit including a memory device, the memory device including memory cells comprising phase change elements having a dynamic resistance, comprising:

performing manufacturing processed to produce an integrated circuit including including a testable memory cell;

testing the testable memory cell by a test process comprising applying a sequence of test pulses to the testable memory cell on the device, which test pulses result in current through the testable memory cell having amplitude dependent on the test pulse;

measuring a resistance of the testable memory cell in response to the sequence of test pulses;

extracting a parameter set including at least one numerical coefficient that models dependence of the measured resistance on the amplitude of the current through the testable memory cell; and analyzing the parameter set, and performing continuing manufacturing if the parameter set meets specified guidelines, else performing at least one of the actions including discarding the integrated circuit device and suspending manufacturing process for pending analysis.

14. The method of claim 13, wherein the sequence of test pulses comprise varying voltage pulses having magnitudes sufficient to melt a portion of the testable memory cell, and durations for thermal transients to settle before said measuring resistance.

15. The method of claim 13, wherein the sequence of test pulses comprise more than 2 varying voltage pulses having equal durations between about 20 and 100 nsec.

16. The method of claim 13, wherein the extracted coefficients include a slope A and an intercept B for a function of the form $$R = A/I + B,$$

where R is the measured resistance and I is the current in the device during a test pulse in the sequence.

17. The method of claim 13, wherein the one or more extracted coefficients include a first coefficient having a value that depends primarily on material properties of the testable memory cell.

18. The method of claim 13, wherein the one or more extracted coefficients include a first coefficient having a value that depends primarily on material properties of the testable memory cell, and a second coefficient having a value that depends on material properties and critical dimensions of the testable memory cell.

19. The method of claim 13, wherein the testable memory cell is characterized by having a bottom electrode contacting a phase change memory element in a contact area, and by formation of a molten region during a test pulse near the bottom electrode having a volume dependent on the contact area and on current magnitude during the test.

20. The method of claim 13, including after said measuring resistance of the testable memory cell in response to the sequence of test pulses, subjecting the testable memory cell to a stress, and then applying a second sequence of test pulses to the testable memory cell, which test pulses result in current through the testable memory cell having amplitude dependent on the test pulse;

measuring resistance of the testable memory cell in response to the second sequence of test pulses;

extracting a second parameter set including at least one numerical coefficient that models dependence of the measured resistance on the amplitude of the current through the testable memory cell during the second sequence of test pulses; and wherein said analyzing the parameter set includes comparing at least one coefficient in the parameter set extracted before said stress with a corresponding coefficient in the second parameter set.

21. The method of claim 13, wherein the memory cell is coupled to one of a bit line and a word line via an access transistor, and including biasing the access transistor in a linear region during said applying a sequence of test pulses.

* * * * *